United States Patent
Lee

(10) Patent No.: US 7,710,158 B2
(45) Date of Patent: May 4, 2010

(54) COMMAND DECODER AND COMMAND SIGNAL GENERATING CIRCUIT

(75) Inventor: Eun Ryeong Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 13 days.

(21) Appl. No.: 12/286,876

(22) Filed: Oct. 2, 2008

(65) Prior Publication Data

US 2009/0302901 A1    Dec. 10, 2009

(30) Foreign Application Priority Data

Jun. 5, 2008    (KR) .................... 10-2008-0053045

(51) Int. Cl.
*H03K 19/082* (2006.01)

(52) U.S. Cl. ......................... 326/105; 326/93

(58) Field of Classification Search ............ 326/93–98, 326/104, 105

See application file for complete search history.

(56) References Cited

U.S. PATENT DOCUMENTS 6,630,850 B2 * 10/2003 Eto et al. .................... 327/141
6,910,096 B2 *  6/2005 Hashimoto et al. .......... 711/105

FOREIGN PATENT DOCUMENTS

| JP | 2005-332496 | 12/2005 |
|---|---|---|
| KR | 10-0225949 B1 | 7/1999 |
| KR | 10-2001-0004656 A | 1/2001 |
| KR | 10-2001-0063504 A | 7/2001 |

* cited by examiner

*Primary Examiner*—Don P Le
(74) *Attorney, Agent, or Firm*—John P. White; Cooper & Dunham LLP

(57) ABSTRACT

A command decoder generates a command signal based on first to fourth control signals in response to a second chip select signal generated by delaying a first chip select signal for a predetermined interval.

24 Claims, 4 Drawing Sheets

COMMAND DECODER AND COMMAND SIGNAL GENERATING CIRCUIT

TECHNICAL FIELD

The present disclosure relates to a semiconductor memory device, and more particularly to a command decoder and a command signal generating circuit, which can prevent a command signal from being unnecessarily enabled when generation of an internal clock is not clear.

BACKGROUND

Generally, a semiconductor memory device receives an external clock signal and operates by using the clock signal as reference timing of an internal operation. In particular, a synchronous DRAM of the semiconductor memory device performs data read and write operations in synchronization with an external clock signal applied from an exterior. Thus, the semiconductor memory device such as the synchronous DRAM includes a clock buffer that generates an internal clock signal for buffering the external clock signal.

The clock buffer is driven in response to a clock enable signal CKE. For example, when the clock enable signal CKE is at a high level, the clock buffer is driven to generate the internal clock signal by buffering the external clock signal. However, when the clock enable signal CKE is at a low level, since the clock buffer is not driven, the internal clock signal is not generated.

Meanwhile, if the clock enable signal CKE is shifted from the low level to the high level, since driving of the clock buffer is determined according to setup/hold time, the internal clock signal may be generated or vice versa. In a state in which generation of the internal clock signal is not clear as described above, a command signal for an internal operation of the semiconductor memory device should not be generated.

However, in the case of the conventional command signal generating circuit (not shown), when generation of the internal clock signal is not clear, the command signal may be generated. Hereinafter, the details will be described with reference to FIG. 1.

As illustrated in FIG. 1, if the clock enable signal CKE is shifted from the low level to the high level, a chip select signal CSB is enabled at a low level during a predetermined interval. During the interval in which the chip select signal CSB is enabled at the low level, when first to fourth control signals CA<0:3>, which control the internal operation of the semiconductor memory device, are at a low level "X", a MRW (mode register write) command signal generated from the command signal generating circuit is enabled at a high level.

In the conventional command signal generating circuit as described above, if the first to fourth control signals CA<0:3> are at a low level in a state in which the chip select signal CSB is shifted to the low level by the clock enable signal CKE shifted to the high level, the MRW command signal is enabled at the high level. During the interval in which the clock enable signal CKE is shifted from the low level to the high level as described above, since generation of the internal clock signal is not clear, the MRW command signal may cause an abnormal operation of the semiconductor memory device.

SUMMARY

In an aspect of the present disclosure, a command decoder and a command signal generating circuit are provided that are capable of preventing a command signal from being unnecessarily enabled by shifting a shift interval of a chip select signal when generation of an internal clock is not clear.

In an embodiment, a command decoder generates a command signal based on first to fourth control signals in response to a second chip select signal generated by delaying a first chip select signal for a predetermined interval.

The command decoder can include a first logic unit for generating a first output signal by performing a logic operation of the first to fourth control signals, a first logic device for generating a second output signal by performing a logic operation of the second chip select signal and the first output signal, and a second logic unit for generating the command signal by performing a logic operation of the second output signal and an internal clock signal.

Preferably, the first output signal generated by the first logic unit is enabled when the first to fourth control signals have a predetermined level.

The first logic unit can include a second logic device for performing a logic operation of the first and second control signals, a third logic device for performing a logic operation of the third and fourth control signals, and a fourth logic device for performing a logic operation of output signals of the second and third logic devices.

Preferably, each of the second and third logic devices performs a NOR operation and the fourth logic device performs a NAND operation.

Preferably, the second chip select signal is generated by delaying the first chip select signal for a predetermined interval according to a signal generated by shifting a clock enable signal.

Preferably, the first logic device transfers the first output signal when the second chip select signal is enabled.

Preferably, the first logic device performs a NOR operation relative to the second chip select signal and the first output signal.

Preferably, the second logic unit performs an AND operation relative to the second output signal and the internal clock signal.

Preferably, the first to fourth control signals are used to control an internal operation of a semiconductor memory device.

Preferably, the command signal is used to enter a mode register set for a semiconductor memory device.

In another embodiment, a command signal generating circuit includes a clock buffer for generating an internal clock signal by buffering an external clock signal in response to a first clock enable signal, a shift register for generating a second clock enable signal by shifting the first clock enable signal in response to the external clock signal, a delay unit for generating a second chip select signal by delaying a first chip select signal for a predetermined interval in response to the second clock enable signal, and a command decoder for generating a command signal based on the internal clock signal, the second chip select signal, and first to fourth control signals.

Preferably, the shift register outputs the second clock enable signal by shifting the first clock enable signal by one period of the external clock signal.

The shift register can include a first transfer device for transferring the first clock enable signal in response to the external clock signal, a first latch for latching the first clock enable signal transferred from the first transfer device, a second transfer device for transferring an output signal of the first latch in response to the external clock signal, a second latch for latching the output signal of the first latch transferred from the second transfer device, and a third transfer device for transferring an output signal of the second latch in response to the external clock signal.

The delay unit can include a logic device for performing a logic operation of the second clock enable signal and an inversion signal of the first chip select signal.

Preferably, the logic device performs a NAND operation.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION OF PREFERRED EMBODIMENTS

Hereinafter, examples and embodiments of the present disclosure will be described with reference to accompanying drawings. However, the examples and embodiments are for illustrative purposes only and are not intended to limit the scope of the invention.

Figure 1:
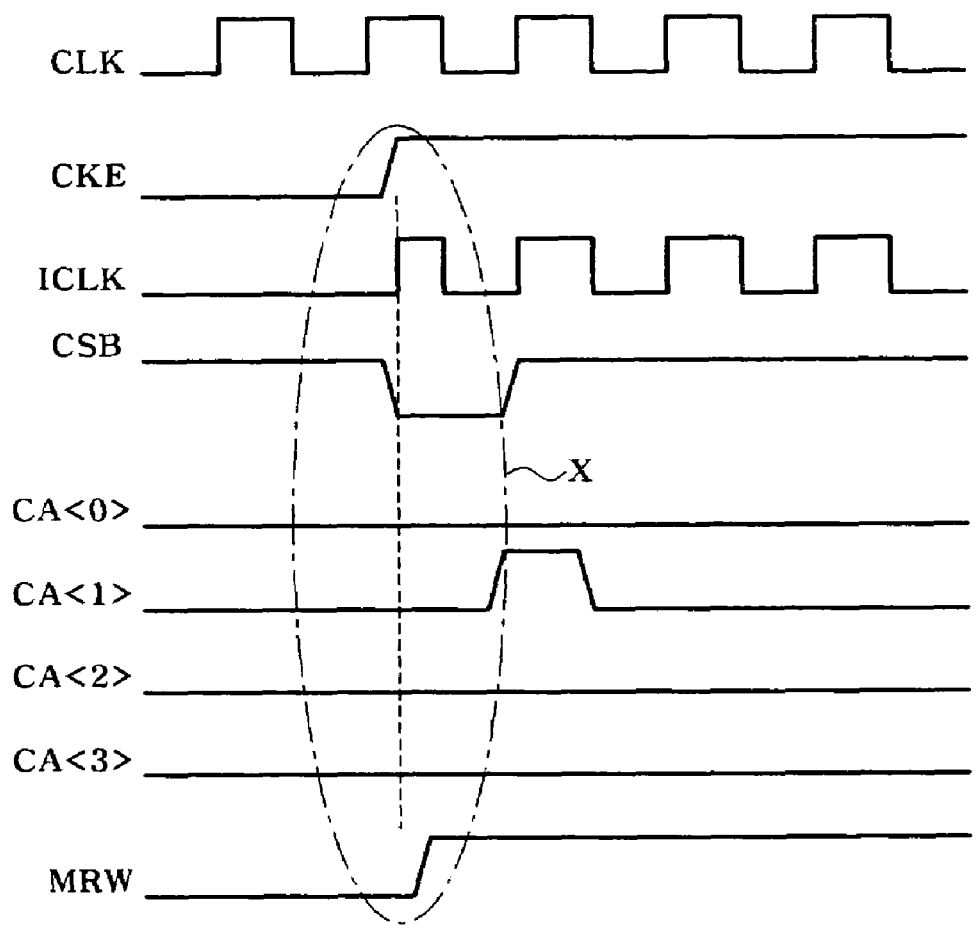
FIG. 1 is a timing chart illustrating an operation of a command signal generating circuit according to the prior art.
Figure 2:
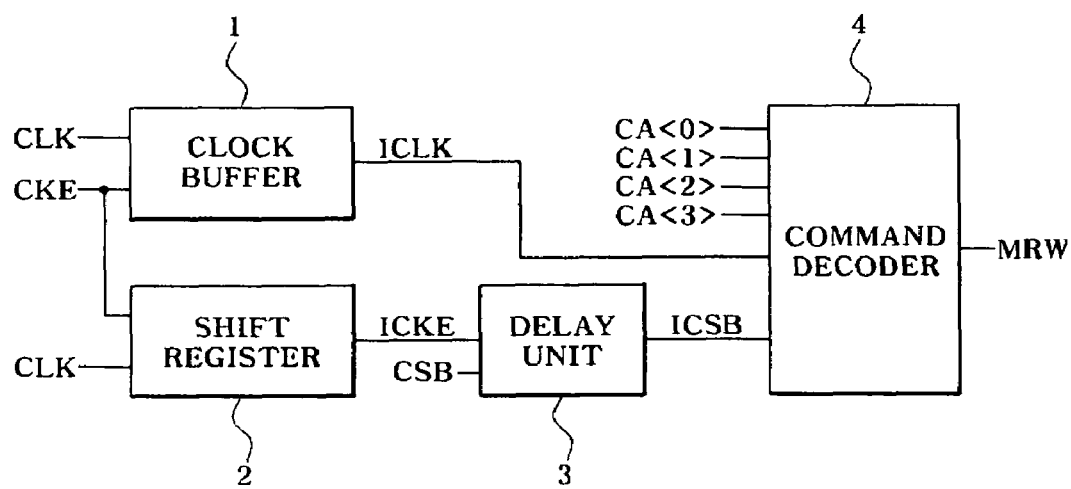
FIG. 2 is a block diagram illustrating an example of a structure of a command signal generating circuit according to an embodiment of the present disclosure.

FIG. 2 is a block diagram illustrating an example of a structure of a command signal generating circuit according to an embodiment of the present disclosure.

As shown in the example of FIG. 2, the command signal generating circuit according to the present embodiment includes a clock buffer 1, a shift register 2, a delay unit 3 and a command decoder 4.

When a first clock enable signal CKE at a high level is received, the clock buffer 1 generates an internal clock signal ICLK by buffering an external clock signal CLK. The first clock enable signal CKE is enabled at a high level for driving the clock buffer 1.

The shift register 2 generates a second clock enable signal ICKE by shifting the first clock enable signal CKE in response to the external clock signal CLK. Hereinafter, an example of a structure of the shift register 2 will be described with reference to FIG. 3.

Figure 3:
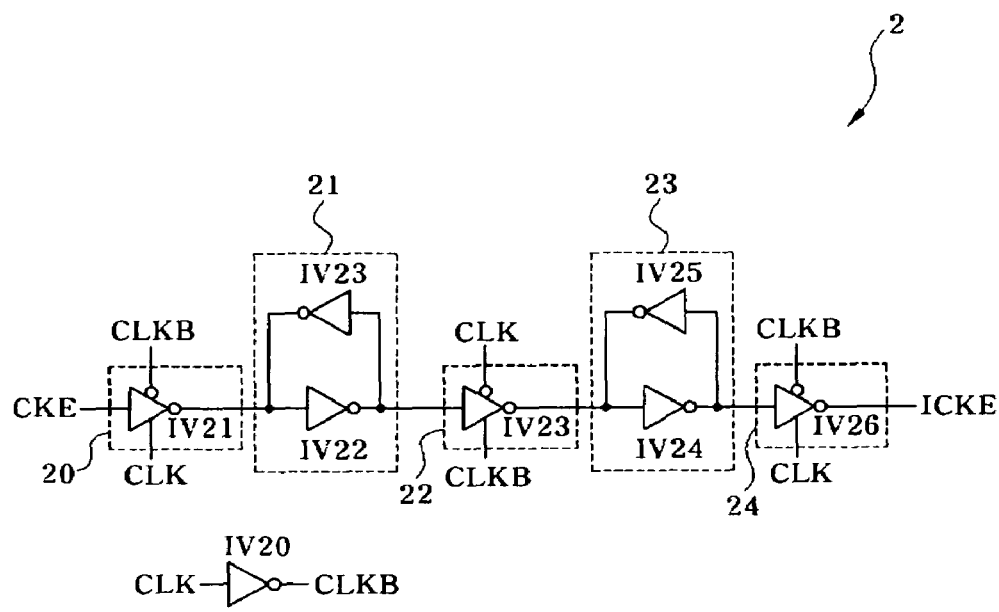
FIG. 3 is a circuit diagram illustrating an embodiment of a shift register in the command signal generating circuit shown in FIG. 2.

As shown in the example of FIG. 3, the shift register 2 includes a first transfer device 20, a first latch 21, a second transfer device 22, a second latch 23 and a third transfer device 24. The first transfer device 20 transfers the first clock enable signal CKE in response to the external clock signal CLK, and the first latch 21 latches the first clock enable signal CKE transferred from the first transfer device 20. The second transfer device 22 transfers an output signal of the first latch 21 in response to the external clock signal CLK, and the second latch 23 latches the output signal of the first latch 21 transferred from the second transfer device 22. The third transfer device 24 transfers an output signal of the second latch 23 in response to the external clock signal CLK.

The shift register 2 having the structure as described above receives the first clock enable signal CKE and outputs the second clock enable signal ICKE generated by shifting the first clock enable signal CKE by one period of the external clock signal CLK.

Figure 4:
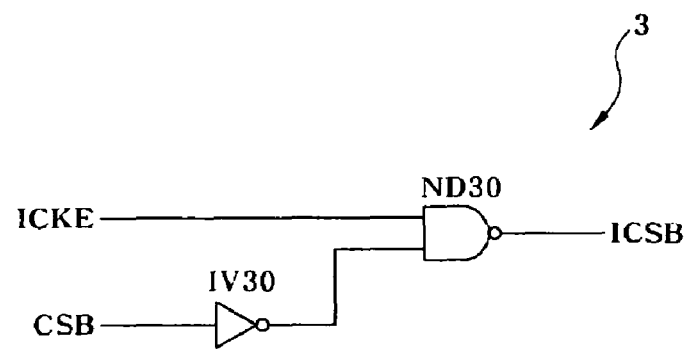
FIG. 4 is a circuit diagram illustrating an embodiment of a delay unit in the command signal generating circuit shown in FIG. 2.

Referring to FIG. 4, the delay unit 3 includes a NAND gate ND30 that receives the second clock enable signal ICKE and an inversion signal of a first chip select signal CSB, and generates a second chip select signal ICSB by NANDing the second clock enable signal ICKE and the inversion signal. The first chip select signal CSB is enabled at a low level during a predetermined interval when the first clock enable signal CKE is shifted to a high level. When the second clock enable signal ICKE is at a high level, the first chip select signal CSB is delayed through an inverter IV30 and the NAND gate ND30, and then is output as the second chip select signal ICSB. Preferably, the delay interval by the inverter IV30 and the NAND gate ND30 is set to one period of the external clock signal CLK.

Figure 5:
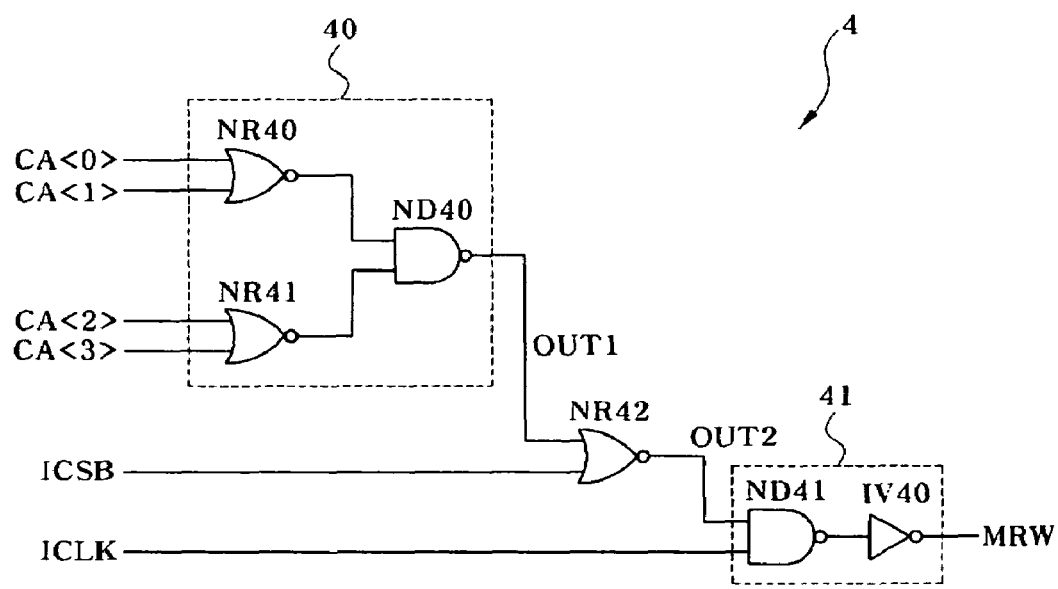
FIG. 5 is a circuit diagram illustrating an embodiment of a command decoder in the command signal generating circuit shown in FIG. 2.

Referring to FIG. 5, the command decoder 4 includes a first logic unit 40, a NOR gate NR42 and a second logic unit 41.

The logic unit 40 includes a NOR gate NR40, a NOR gate NR41 and a NAND gate ND 40. The NOR gate NR40 receives first and second control signals CA<0:1> and NORs the first and second control signals CA<0:1>. The NOR gate NR41 receives third and fourth control signals CA<2:3> and NORs the third and fourth control signals CA<2:3>. The NAND gate ND 40 receives output signals of the NOR gate NR40 and the NOR gate NR41, and generates a first output signal OUT1 by NANDing the output signals. The first to fourth control signals CA<0:3> are used to control an internal operation of a semiconductor memory device, and include a RAS signal, a CAS signal and a WE signal generally used for a DRAM. In the case of a LPDDR2 (low power DDR2), the first to fourth control signals CA<0:3> are used as control signals of an address signal or the RAS signal, the CAS signal and the WE signal in response to the external clock signal CLK.

The NOR gate NR42 receives the first output signal OUT1 and the second chip select signal ICSB, and generates a second output signal OUT2 by NORing the first output signal OUT1 and the second chip select signal ICSB. The NOR gate NR42 transfers the first output signal OUT1 as the second output signal OUT2 during an interval in which the second chip select signal ICSB at a low level is input.

The second logic unit 41 receives the second output signal OUT2 and the internal clock signal ICLK, and generates a MRW command signal by ANDing the second output signal OUT2 and the internal clock signal ICLK. The MRW command signal is used to enter a mode register set for setting BL (burst length), CL (CAS latency) and the like in the LPDDR2.

Hereinafter, an operation of the command signal generating circuit will be described with reference to FIG. 6.

Figure 6:
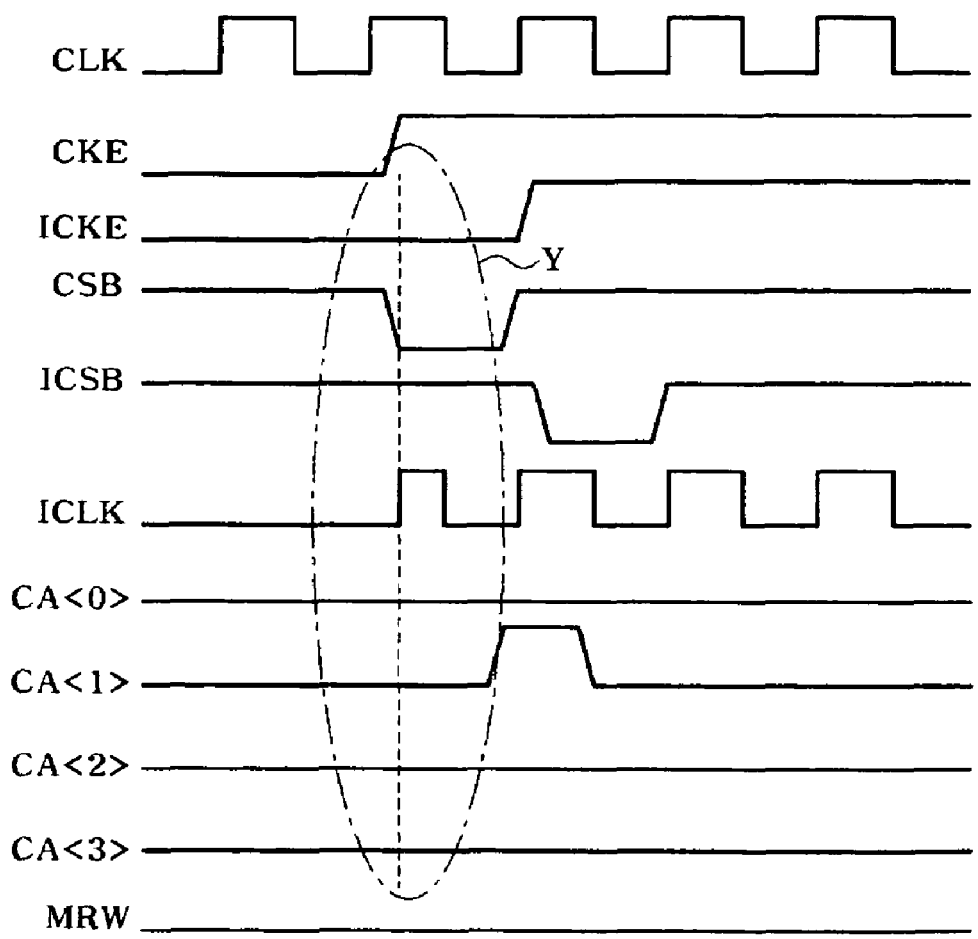
FIG. 6 is a timing chart illustrating an example of an operation of a command signal generating circuit according to an embodiment of the present disclosure.

As shown in the example of FIG. 6, if the first clock enable signal CKE is shifted from a low level to a high level, the first chip select signal CSB is enabled at a low level during a predetermined interval. In the prior art, when the first to fourth control signals CA<0:3> are at a low level during the interval for which the first chip select signal CSB is enabled at the low level, the MRW command signal may be unnecessarily enabled at a high level.

In this regard, the command signal generating circuit of the present embodiment generates the second clock enable signal ICKE by shifting the first clock enable signal CKE by one period of the external clock signal CLK, and generates the second chip select signal ICSB by delaying an enable interval of the first chip select signal CSB through use of the second clock enable signal ICKE. Then, the command signal generating circuit generates the MRW command signal by using the second chip select signal ICSB, thereby preventing the MRW command signal from being unnecessarily enabled in a state in which generation of the internal clock signal ICLK is not clear after the first clock enable signal CKE is shifted from the low level to the high level.

The details are as follows.

First, the shift register 2 shown in FIG. 3 generates the second clock enable signal ICKE by shifting the first clock enable signal CKE by one period of the external clock signal CLK. In more detail, if the external clock signal CLK is at a high level, the first transfer device 20 transfers the first clock enable signal CKE to the first latch 21. Then, if the external clock signal CLK is shifted to a low level, the shift register 2 transfers the signal latched by the first latch 21 to the second latch 23. If the external clock signal CLK is shifted to the high level again, the signal latched by the second latch 23 is output as the second clock enable signal ICKE. Thus, the second clock enable signal ICKE is generated by shifting the first clock enable signal CKE by one period of the external clock signal CLK.

Next, the delay unit 3 shown in FIG. 4 generates the second chip select signal ICSB by delaying the first chip select signal CSB for a predetermined interval in response to the second clock enable signal ICKE. In more detail, during an interval for which the second clock enable signal ICKE is enabled at a high level, the first chip select signal CSB is delayed by an amount of time in which the first chip select signal CSB passes through the inverter IV30 and the NAND gate ND30, and then is output as the second chip select signal ICSB. At this time, since the delay interval by the inverter IV30 and the NAND gate ND30 is set to one period of the external clock signal CLK, an enable interval of the second chip select signal ICSB is shifted, from the point at which the first clock enable signal CKE is shifted from the low level to the high level, by one period of the external clock signal CLK.

Then, the command decoder 4 shown in FIG. 5 generates the MRW command signal in response to the second chip select signal ICSB. According to the present embodiment, after one period of the external clock signal CLK passes from the point at which the first clock enable signal CKE is shifted to the high level, the second chip select signal ICSB enabled for a predetermined interval is input to the command decoder 4. Thus, after the first clock enable signal CKE is shifted to the high level, even if the first to fourth control signals CA<0:3> at a low level are input to the command decoder 4 (see "Y" of FIG. 6), the MRW command signal is not enabled at a high level. In detail, during one period of the external clock signal CLK from the point at which the first clock enable signal CKE is shifted to the high level, since the second chip select signal ICSB is maintained at the high level, the NOR gate NR42 outputs a low level regardless of the levels of the first to fourth control signals CA<0:3>, thereby allowing the MRW command signal to be disabled at a low level.

As described above, the command signal generating circuit of the present embodiment can prevent the MRW command signal from being unnecessarily enabled according to the levels (e.g. all low levels) of the first to fourth control signals CA<0:3> in a state in which generation of the internal clock signal ICLK is not clear after the first clock enable signal CKE is shifted from the low level to the high level.

The present disclosure claims priority to Korean application 10-2008-0053045, filed on Jun. 5, 2008, the entire contents of which are incorporated herein by reference.

What is claimed is:

1. A command decoder generating a command signal based on first to fourth control signals in response to a second chip select signal generated by delaying a first chip select signal for a predetermined interval.

2. The command decoder of claim 1, the command decoder comprising:
   a first logic unit for generating a first output signal by performing a logic operation of the first to fourth control signals;
   a first logic device for generating a second output signal by performing a logic operation of the second chip select signal and the first output signal; and
   a second logic unit for generating the command signal by performing a logic operation of the second output signal and an internal clock signal.

3. The command decoder of claim 1, wherein the first output signal generated by the first logic unit is enabled when the first to fourth control signals have a predetermined level.

4. The command decoder of claim 3, wherein the first logic unit includes:
   a second logic device for performing a logic operation of the first and second control signals;
   a third logic device for performing a logic operation of the third and fourth control signals; and
   a fourth logic device for performing a logic operation of output signals of the second and third logic devices.

5. The command decoder of claim 4, wherein each of the second and third logic devices performs a NOR operation and the fourth logic device performs a NAND operation.

6. The command decoder of claim 1, wherein the second chip select signal is generated by delaying the first chip select signal for the predetermined interval according to a signal generated by shifting a clock enable signal.

7. The command decoder of claim 2, wherein the first logic device transfers the first output signal when the second chip select signal is enabled.

8. The command decoder of claim 7, wherein the first logic device performs a NOR operation of the second chip select signal and the first output signal.

9. The command decoder of claim 2, wherein the second logic unit performs an AND operation of the second output signal and the internal clock signal.

10. The command decoder of claim 2, wherein the first to fourth control signals are used to control an internal operation of a semiconductor memory device.

11. The command decoder of claim 1, wherein the command signal is used to enter a mode register set for a semiconductor memory device.

12. A command signal generating circuit comprising:
   a clock buffer for generating an internal clock signal by buffering an external clock signal in response to a first clock enable signal;
   a shift register for generating a second clock enable signal by shifting the first clock enable signal in response to the external clock signal;
   a delay unit for generating a second chip select signal by delaying a first chip select signal for a predetermined interval in response to the second clock enable signal; and
   a command decoder for generating a command signal based on the internal clock signal, the second chip select signal, and first to fourth control signals.

13. The command signal generating circuit of claim 12, wherein the shift register outputs the second clock enable signal by shifting the first clock enable signal by one period of the external clock signal.

14. The command signal generating circuit of claim 12, wherein the shift register includes:
   a first transfer device for transferring the first clock enable signal in response to the external clock signal;
   a first latch for latching the first clock enable signal transferred from the first transfer device;
   a second transfer device for transferring an output signal of the first latch in response to the external clock signal;
   a second latch for latching the output signal of the first latch transferred from the second transfer device; and
   a third transfer device for transferring an output signal of the second latch in response to the external clock signal.

15. The command signal generating circuit of claim 12, wherein the delay unit includes a logic device for performing a logic operation of the second clock enable signal and an inversion signal of the first chip select signal.

16. The command signal generating circuit of claim 15, wherein the logic device performs a NAND operation.

17. The command signal generating circuit of claim 12, wherein the command decoder includes:
   a first logic unit for generating a first output signal by performing a logic operation of the first to fourth control signals;
   a first logic device for generating a second output signal by performing a logic operation of the second chip select signal and the first output signal; and
   a second logic unit for generating the command signal by performing a logic operation of the second output signal and the internal clock signal.

18. The command signal generating circuit of claim 17, wherein the first output signal generated by the first logic unit is enabled when the first to fourth control signals have a predetermined level.

19. The command signal generating circuit of claim 18, wherein the first logic unit includes:
   a second logic device for performing a logic operation of the first and second control signals;
   a third logic device for performing a logic operation of the third and fourth control signals; and
   a fourth logic device for performing a logic operation of output signals of the second and third logic devices.

20. The command signal generating circuit of claim 19, wherein each of the second and third logic devices performs a NOR operation and the fourth logic device performs a NAND operation.

21. The command signal generating circuit of claim 17, wherein the second chip select signal is generated in the delay unit by delaying the first chip select signal for the predetermined interval according to a signal generated by shifting a clock enable signal.

22. The command signal generating circuit of claim 17, wherein the first logic device transfers the first output signal when the second chip select signal is enabled.

23. The command signal generating circuit of claim 17, wherein the first to fourth control signals are used to control an internal operation of a semiconductor memory device.

24. The command signal generating circuit of claim 17, wherein the command signal is used to enter a mode register set for a semiconductor memory device.

* * * * *